United States Patent
Kamiya et al.

(10) Patent No.: US 9,939,472 B2
(45) Date of Patent: Apr. 10, 2018

(54) DETECTION APPARATUS, POWER SUPPLY APPARATUS AND POWER SUPPLY SYSTEM FOR SUPPLYING POWER

(71) Applicant: Sony Corporation, Tokyo (JP)

(72) Inventors: Koji Kamiya, Kanagawa (JP); Masaki Awaji, Kanagawa (JP); Yasuyuki Haruta, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 842 days.

(21) Appl. No.: 13/860,863

(22) Filed: Apr. 11, 2013

(65) Prior Publication Data
US 2013/0297238 A1    Nov. 7, 2013

(30) Foreign Application Priority Data
May 2, 2012    (JP) .................. 2012-105348

(51) Int. Cl.
    *G01R 21/133*    (2006.01)
    *G01R 31/40*    (2014.01)

(52) U.S. Cl.
    CPC .......... *G01R 21/133* (2013.01); *G01R 31/40* (2013.01)

(58) Field of Classification Search
None
See application file for complete search history.

(56) References Cited

U.S. PATENT DOCUMENTS

| | | | | |
|---|---|---|---|---|
| 4,151,490 A | * | 4/1979 | Bazin | H04N 7/102 333/16 |
| 4,860,095 A | * | 8/1989 | Kimura | A61B 1/05 348/241 |
| 5,159,275 A | * | 10/1992 | Fujimura | G01B 7/026 324/617 |
| 5,235,618 A | * | 8/1993 | Sakai | H04N 21/23406 358/426.07 |

(Continued)

FOREIGN PATENT DOCUMENTS

| JP | 07-087380 A | 3/1995 |
|---|---|---|
| JP | 07-222039 A | 8/1995 |

(Continued)

OTHER PUBLICATIONS

Keisuke, (JP 2002300462A), Oct. 2002, English translated.*

(Continued)

*Primary Examiner* — John Breene
*Assistant Examiner* — Mohammad Islam
(74) *Attorney, Agent, or Firm* — Chip Law Group

(57) ABSTRACT

A detection apparatus includes a first acquisition part that acquires information about a suppliable electric power of a power supply apparatus that supplies an electric power to a power reception apparatus via a transmission path; a second acquisition part that acquires information about a supply electric power output from the power supply apparatus, including information about a supply voltage output from power supply apparatus; a third acquisition part that acquires information about a voltage applied to the power reception (Continued)

apparatus after a voltage drop in the transmission path; and a margin information calculation part that calculates first margin information about a margin of a supply electric power, and calculates second margin information about a margin of the voltage drop.

13 Claims, 7 Drawing Sheets

(56) References Cited

U.S. PATENT DOCUMENTS

| | | | | | |
|---|---|---|---|---|---|
| 5,245,291 | A | * | 9/1993 | Fujimura | G01B 7/026 324/617 |
| 5,621,429 | A | * | 4/1997 | Yamaashi | G06F 3/04845 345/428 |
| 5,701,581 | A | * | 12/1997 | Eto | H04N 5/23203 348/14.13 |
| 5,805,202 | A | * | 9/1998 | Mullins | H04N 7/18 348/143 |
| 5,959,293 | A | * | 9/1999 | Ishikawa | H04B 10/071 250/227.14 |
| 6,489,854 | B1 | * | 12/2002 | Chen | G01B 7/02 257/E23.067 |
| 6,587,885 | B1 | * | 7/2003 | Nakayama | H04N 21/4305 375/E7.14 |
| 7,532,998 | B2 | * | 5/2009 | Chen | H04B 3/56 348/691 |
| 8,090,553 | B2 | * | 1/2012 | Chen | H04B 3/56 348/691 |
| 8,266,335 | B2 | * | 9/2012 | Kitano | G09G 5/006 710/15 |
| 8,457,312 | B2 | * | 6/2013 | Yeh | H04N 7/108 348/528 |
| 2002/0147568 | A1 | * | 10/2002 | Wenzel | G01B 11/2518 702/167 |
| 2002/0157117 | A1 | * | 10/2002 | Geil | H04N 7/102 725/139 |
| 2006/0261282 | A1 | * | 11/2006 | Nakajima | H04N 5/0733 250/370.14 |
| 2010/0124270 | A1 | * | 5/2010 | Yeh | H04N 7/108 375/240.01 |
| 2010/0135381 | A1 | * | 6/2010 | Hamamoto | H04N 21/23406 375/240.01 |
| 2011/0249181 | A1 | * | 10/2011 | Iwami | H04N 21/242 348/501 |
| 2014/0320671 | A1 | * | 10/2014 | Furihata | H04N 5/262 348/184 |

FOREIGN PATENT DOCUMENTS

| | | | |
|---|---|---|---|
| JP | 08-294273 A | | 11/1996 |
| JP | 2002300462 A | * | 10/2002 |
| JP | 2006-319632 A | | 11/2006 |
| JP | 2007-295538 A | | 11/2007 |
| JP | 2011-055543 A | | 3/2011 |
| JP | 2012-060457 A | | 3/2012 |

OTHER PUBLICATIONS

CCTV, Voltage & Amperage Guide for your CCTV Cameras, 2011.*

Japanese Office Action dated Nov. 10, 2015 in patent application No. 2012105348.

* cited by examiner

DETECTION APPARATUS, POWER SUPPLY APPARATUS AND POWER SUPPLY SYSTEM FOR SUPPLYING POWER

BACKGROUND

The present technology relates to a detection apparatus, a power supply apparatus, a power reception apparatus, a power supply system, and a program for use in supplying an electric power via a cable etc.

For example, in a display apparatus described in Japanese Patent Application Laid-open No. HEI 08-294273 (hereinafter, referred to as Patent Document 1), a panel and a power supply are connected via a power supply cable. A driving electric power of the panel is supplied from the power supply via the power supply cable. At this moment, a voltage drop is detected as appropriate depending on a length of the power supply cable. Then, a voltage obtained by correcting the voltage drop is output from the power supply. In this way, even when the power supply cable having any length is used, the voltage supplied to the panel is limited within an allowable voltage range (see Patent Document 1 [0004], [0005]).

Japanese Patent Application Laid-open No. HEI 07-87380 (hereinafter, referred to as Patent Document 2) describes a power supply system for supplying an electric power to a video camera from a power supply apparatus via a cable. In this system, a transmission of video camera control signals and video signals, and a supply of a driving electric power to the video camera are performed by a single cable. In this case, by supplying a minimum necessary electric power depending on an action of the video camera, a waste power consumption and heat generation within the video camera are inhibited (see Patent Document 2 [0010], [0033]).

SUMMARY

In a power supply system for supplying an electric power to a predetermined device via a cable, as described above, an electric power is desirably supplied with good handleability.

There is a need for a detection apparatus, a power supply apparatus, a power reception apparatus and a program for providing a power supply system with good handleability to supply an electric power via a transmission path, and the power supply system.

According to an embodiment of the present technology, there is provided a detection apparatus including a first acquisition part, a second acquisition part, a third acquisition part and a margin information calculation part.

The first acquisition part acquires information about a suppliable electric power of a power supply apparatus that supplies an electric power to a power reception apparatus via a transmission path.

The second acquisition part acquires information about a supply electric power output from the power supply apparatus, including information about a supply voltage output from the power supply apparatus.

The third acquisition part acquires information about a voltage applied to the power reception apparatus after a voltage drop in the transmission path.

The margin information calculation part calculates first margin information that represents a margin for the power supply based on the information about the suppliable electric power and the information about the supply electric power, and second margin information about a margin of the voltage drop based on the information about the supply voltage and the information about an applied voltage.

In the detection apparatus, each of the information about the suppliable electric power of the power supply apparatus, the information about the supply voltage output from the power supply apparatus, and the information about the voltage applied to the power reception apparatus is acquired. Based on the information acquired, the first margin information that represents the margin for the power supply, and the second margin information represents the margin of the voltage drop are calculated. By using the first and second margin information is used as appropriate, it is possible to get a power supply status. As a result, it can provide the power supply system having good operability that supplies an electric power via the transmission path.

The power supply apparatus may output a predetermined fixed voltage as the supply voltage. In this case, the information about the suppliable electric power may include information about a suppliable electric power of the power supply apparatus. The information about the supply electric power may include information about a supply electric power output from the power supply apparatus. Also, the margin information calculation part calculates the first margin information based on the information about the suppliable electric power and the information about the supply electric power.

Thus, when the fixed voltage is output from the power supply apparatus, the information about the suppliable electric power may be used as the information about the suppliable electric power. Then, based on the information about the suppliable electric power and the information about the supply current as the information about the supply electric power, the first margin information may be calculated.

The information about the supply voltage may include the information about the fixed voltage. In this case, the margin information calculation part calculates the second margin information based on the information about the fixed voltage and the information about the applied voltage.

In this way, the second margin information may be calculated based on the information about the fixed voltage and the information about the applied voltage.

The margin information calculation part may calculate the second margin information using a greater value among a half value of the fixed voltage and a value of a driving voltage necessary for driving the power reception apparatus.

In this way, the second margin information may be calculated using a greater value among a half value of the fixed voltage and a value of a driving voltage necessary for driving the power reception apparatus.

The power reception apparatus may include an electric power control unit for supplying a predetermined electric power. In this case, the detection apparatus may further include a fourth acquisition part that acquires information about an electric power control unit including information about the suppliable electric power of the electric power control unit and information about a supply electric power output from the electric power control unit. In addition, the margin information calculation part may calculate third margin information that represents a margin of the supply electric power on the electric power control unit based on the information about the electric power control unit.

Thus, the power supply status of the electric power control unit at the power reception side may be calculated as the third margin information. This enables a power supply system to have good handleability.

In the second acquisition part, the information about the supply current may be acquired by calculating the supply current based on the information about the supply voltage, the information about the applied voltage and the information about the resistance of the transmission path corresponding to the length of the transmission path.

Thus, the information about the supply current may be calculated based on the above-described information. It is effective in the case that the supply current is difficult to be detected, for example.

The information about the length of the transmission path may be calculated based on a difference between a phase of a reference synchronizing signal transmitted from the power supply apparatus to the power reception apparatus via the first transmission path in order to control the operation timing of the power reception apparatus, and a phase of a reply synchronizing signal returned from the power reception apparatus to the power supply apparatus at the operation timing controlled based on the reference synchronizing signal.

Thus, the information about the length of the transmission path for calculating the information about the supply current may be calculated based on the difference between the phases of the reference synchronizing signal and the reply synchronizing signal. In this way, the length of the transmission path can be easily calculated.

The reference synchronizing signal and the reply synchronizing signal may be each a frame synchronizing signal.

Thus, the length of the transmission path may be calculated using the frame synchronizing signal. Thus, setting a new synchronizing signal for calculating the length of the transmission path may be calculated is unnecessary. As a result, the length of the transmission path can be easily calculated.

The margin information calculation part may output at least one of the first and second margin information calculated as display information displayed on a display unit.

Thus, it is possible to get a power supply status via the display unit. The display unit maybe disposed on the detection apparatus, or may be disposed as the external device outside of the detection apparatus.

A power supply apparatus according to an embodiment of the present technology includes a power supply unit, a memory unit, a detection unit, an acquisition part, and a margin information calculation part.

The power supply unit supplies an electric power to a power reception apparatus connected via a transmission path.

The memory unit stores information about a suppliable electric power of a power supply unit.

The detection unit detects information about a supply electric power output from the power supply unit, including information about a supply voltage output from the power supply unit.

The acquisition part acquires information about a voltage applied to the power reception apparatus after a voltage drop in the transmission path.

The margin information calculation part calculates first margin information about a margin of the supply electric power based on the information about the suppliable electric power and the information about the supply electric power, and calculates a margin information about a margin of the voltage drop based on the information about the supply voltage and the information about the applied voltage.

A power reception apparatus according to an embodiment of the present technology includes a power reception unit, a first acquisition part, a second acquisition part, a detection unit, and a margin information calculation part.

The power reception unit receives an electric power supplied from a power supply apparatus connected via a transmission path.

The first acquisition part acquires information about the suppliable electric power of the power supply apparatus.

The second acquisition part acquires information about a supply electric power output from the power supply unit, including information about a supply voltage output from the power supply unit.

The detection unit detects information about a voltage applied to the power reception unit after a voltage drop in the transmission path.

The margin information calculation part calculates first margin information about a margin of the supply electric power based on the information about the suppliable electric power and the information about the supply electric power, and calculates second margin information about a margin of the voltage drop based on the information about the supply voltage and the information about the applied voltage.

Thus, the power supply apparatus may have a function to calculate the first and second margin information.

A power supply system according to an embodiment of the present technology includes a power supply apparatus, a power reception apparatus, and a detection apparatus.

The power supply apparatus includes a power supply unit, a memory unit, and a first detection unit.

The power supply unit supplies an electric power connected via a transmission path.

The memory unit stores the information about the suppliable electric power of the power supply unit.

The first detection unit detects information about a supply electric power output from the power supply unit, including information about a supply voltage output from the power supply unit.

The power reception apparatus includes a power reception unit and a second detection unit.

The power reception apparatus receives an electric power supplied from a power supply apparatus connected via a transmission path.

The second detection unit detects information about a voltage applied to the power reception unit after a voltage drop in the transmission path.

The detection apparatus calculates first margin information about a margin of the supply electric power based on the information about the suppliable electric power and the information about the supply electric power, and calculates second margin information about a margin of the voltage drop based on the information about the supply voltage and the information about the applied voltage.

A program according to an embodiment of the present technology including the following steps is executed by a computer. The steps include:

acquiring information about a suppliable electric power of a power supply apparatus that supplies an electric power to a power reception apparatus via a transmission path, acquiring information about a supply electric power output from the power supply unit, including information about a supply voltage output from the power supply unit, acquiring information about a voltage applied to the power reception apparatus after a voltage drop in the transmission path, and calculating first margin information about a margin of a supply electric power based on the information about the suppliable electric power and the information about the supply electric power, and calculating second margin information about a margin of the voltage drop based on the information about the supply voltage and the information about the applied voltage.

As described above, the present technology achieves a power supply system with good handleability to supply an electric power via a transmission path.

These and other objects, features and advantages of the present technology will become more apparent in light of the following detailed description of best mode embodiments thereof, as illustrated in the accompanying drawings.

DETAILED DESCRIPTION OF EMBODIMENTS

Hereinafter, an embodiment of the present technology will be described with reference to the drawings.

First Embodiment

[Camera Control System]

Figure 1:
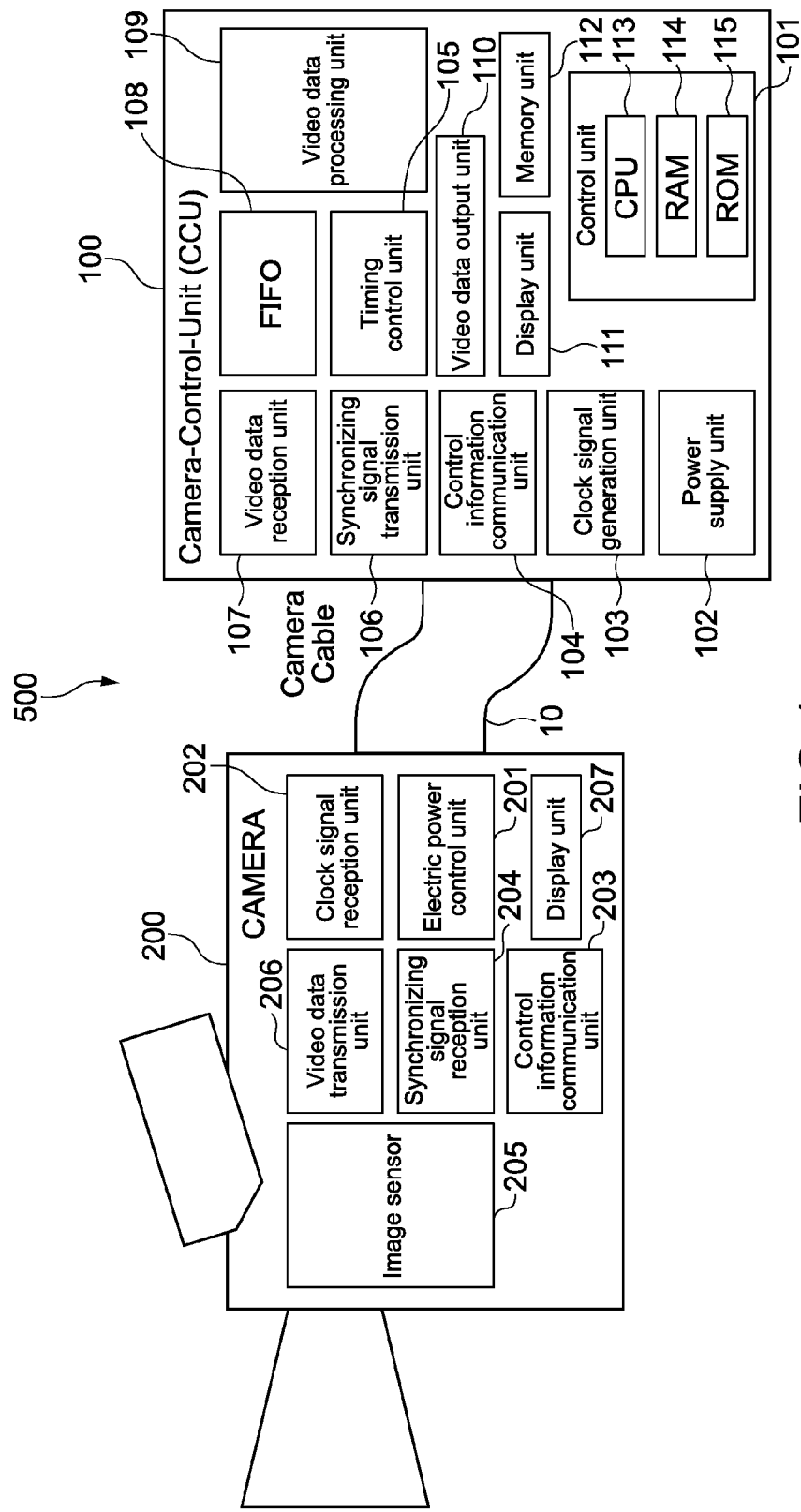
FIG. 1 is a schematic diagram showing a configuration embodiment of a camera control system according to a first embodiment.

An overview of a camera control system using a power supply system according to an embodiment of the present technology will be described. FIG. 1 is a schematic block diagram showing a configuration embodiment of the camera control system.

A camera control system 500 includes a camera control unit (hereinafter referred to as CCU) 100, and a camera 200 connected to the CCU 100 via a cable 10. The camera 200 is a video camera for outputting video data (image data) captured. The CCU 100 carries out recording, editing, displaying etc. of the video data captured by the camera 200. Also, the CCU 100 controls a capturing action etc. by the camera 200.

In FIG. 1, one camera 200 is connected to one CCU 100 via the cable 10, but is not limited thereto. A plurality of cameras may be connected to one CCU. Also, the camera control system 500 may be used as one system camera.

The CCU 100 includes a control unit 101, a power supply unit 102, a clock signal generation unit 103, a control information communication unit 104, a timing control unit 105 and a synchronizing signal transmission unit 106. In addition, the CCU 100 includes a video data reception unit 107, a FIFO 108, a video data processing unit 109, a video data output unit 110, a display unit 111 and a memory unit 112.

The control unit 101 includes a CPU (Central Processing Unit) 113, RAM (Random Access memory) 114 and a ROM (Read Only Memory) 115. The CPU 113 loads and executes a control program pre-recorded in the ROM 115 on the RAM 114 to control respective units of the CCU 100.

The power supply unit 102 supplies a driving electrical power to each unit of the CCU 100 using a power supply, e.g., AC (Alternating Current) power supply or a buttery (either of which is not shown), and supplies a driving electrical power to the camera 200 via the cable 10. The power supply unit 102 will be described below in detail.

The clock signal generation unit 103 generates a clock signal, supplies the generated clock signal to each unit of the CCU 100, and also supplies to the camera 200 via the cable 10. In this embodiment, the clock signal generation unit generates the clock signal at 74 MHz. The frequency of the clock signal is not limited.

The control information communication unit 104 communicates a variety of control information with the camera 200 via the cable 10.

The timing control unit 105 outputs synchronizing signals (a frame synchronizing signal, a vertical synchronizing signal and a horizontal synchronizing signal) output from the video data processing unit 109 to the synchronizing signal transmission unit 106 at a predetermined phase. Also, the timing control unit 105 controls a readout timing of video data held in the FIFO 108.

The synchronizing signal transmission unit 106 transmits the synchronizing signals from the timing control unit 105 to the camera 200 via the cable 10. The video data reception unit 107 receives the video data from the camera 200 via the cable 10. In addition, the video data reception unit 107 outputs the received image data to the FIFO 108 and controls a write-in timing. For example, the FIFO 108 may be divided into three corresponding to respective three primary colors RGB.

The video data processing unit 109 processes the video data output from the FIFO 108 as prescribed and outputs the video data to the video data output unit 110. The video data output unit 110 supplies the video data after the video data processing to the display unit 111 and the memory unit 112. Also, the video data output unit 110 outputs the video data after the video data processing to an external device outside of the CCU 100.

The display unit 111 displays the video (image) based on the image data from the video data output unit 110 on a display (not shown). Also, the display unit 111 displays the variety of information output from the control unit 101 etc. on the display with a UI (User Interface).

The memory unit 112 encodes the video data from the video data output unit 110 in accordance with a predetermined method, and records the resultant encoded signals into a recording medium (not shown). In addition, the memory unit 112 stores a variety of information including user's setting information.

The cable 10 is provided by bundling, for example, a light transmission line, a control line and an electric power supply line as one cable. The light transmission line includes an optical fiber cable. The control line and the electric power supply line include a plurality of copper lines. These lines may be disposed separately.

The light transmission line is mainly used for transmitting the video signals. For example, the resultant video data captured by the camera 200 is transmitted to the CCU 100 via the light transmission line. The video signals (RET signals) returned from the CCU 100, and the video data captured by other camera etc. are transmitted to the camera 200 via the light transmission line.

The control line is mainly used for transmitting the control information etc. For example, the control information generated at the CCU 100 is transmitted to the camera 200 via the control line. Also, a variety of information including a reply to the control information is transmitted from the camera 200 to the CCU 100 via the control line. The control information etc. may be transmitted by the light transmission line as described above. For example, the control information etc. may be multiplexed with the transmitted information and then transmitted. In this case, the control line may be omitted.

The electric power supply line is used for transmitting the driving electric power supplied from the power supply unit 102 of the CCU 100 to the camera 200.

In the cable 10, a plurality of lines may be disposed in order to transmit the video data, the synchronizing signals, the control information, the clock signal etc. as described above at each predetermined communication speed (Mbps). For example, a cable having a plurality of transmission lines such as an electric power supply path, a clock signal supply path, a high speed signal transmission path and a ultrahigh speed signal transmission path may be used. The configuration of the cable 10 is not otherwise limited.

The length of the cable 10 used in the camera control system 500 is not limited. For example, the cable 10 having a length of tens meters or hundreds meters is used. Alternatively, the cable 10 having a length of several kilometers may be used.

The camera 200 captures the image based on the driving electric power and the clock signal supplied from the CCU 100 in accordance with the control by the CCU 100, and outputs the video data captured to the CCU 100 via the cable.

The camera 200 includes an electric power control unit 201, a clock signal reception unit 202, a control information communication unit 203, a synchronizing signal reception unit 204, an image sensor 205, a video data transmission unit 206 and a display unit 207.

The electric power control unit 201 supplies the driving electric power supplied from the power supply unit 102 of the CCU 100 via the cable 10 to respective units of the camera 200. The clock signal reception unit 202 receives the clock signal transmitted from the clock signal generation unit 103 of the CCU 100, frequency-divides the received clock signal to an operating frequency of the camera 200 and supplies the clock signal to the control information communication unit 203.

The control information communication unit 203 receives the control information transmitted from the control information communication unit 104 via the cable 10. Also, the control information communication unit 203 controls the image sensor 205 based on the clock signal from the clock signal reception unit 202 and the synchronizing signals from the synchronizing signal reception unit 204 in accordance with the control information from the CCU 100. Further, the control information communication unit 203 generates the control information to be notified to the CCU 100, and transmits the control information to the control information communication unit 104 of the CCU 100 via the cable 10.

The synchronizing signal reception unit 204 receives the synchronizing signals from the synchronizing signal transmission unit 106 of the CCU 100 via the cable 10, and supplies the received synchronizing signals to the control information communication unit 203.

The image sensor 205 generates the video data and supplies the video data to the video data transmission unit 206. Examples of the image sensor include CMOS (Complementary Metal Oxide Semiconductor) and CCD (Charge Coupled Devices) sensors and the like. For example, three image sensors corresponding to respective three primary colors RGB may be used.

The video data transmission unit 206 transmits the video data from the image sensor 205 to the video data reception unit 107 of the CCU 100 via the cable 10.

The display unit 207 displays the video based on the video data generated by the image sensor 205 on a display (not shown). Also, the display unit 207 displays the variety of information output from the CCU 100 on the display with the UI.

[Power Supply System]

Figure 2:
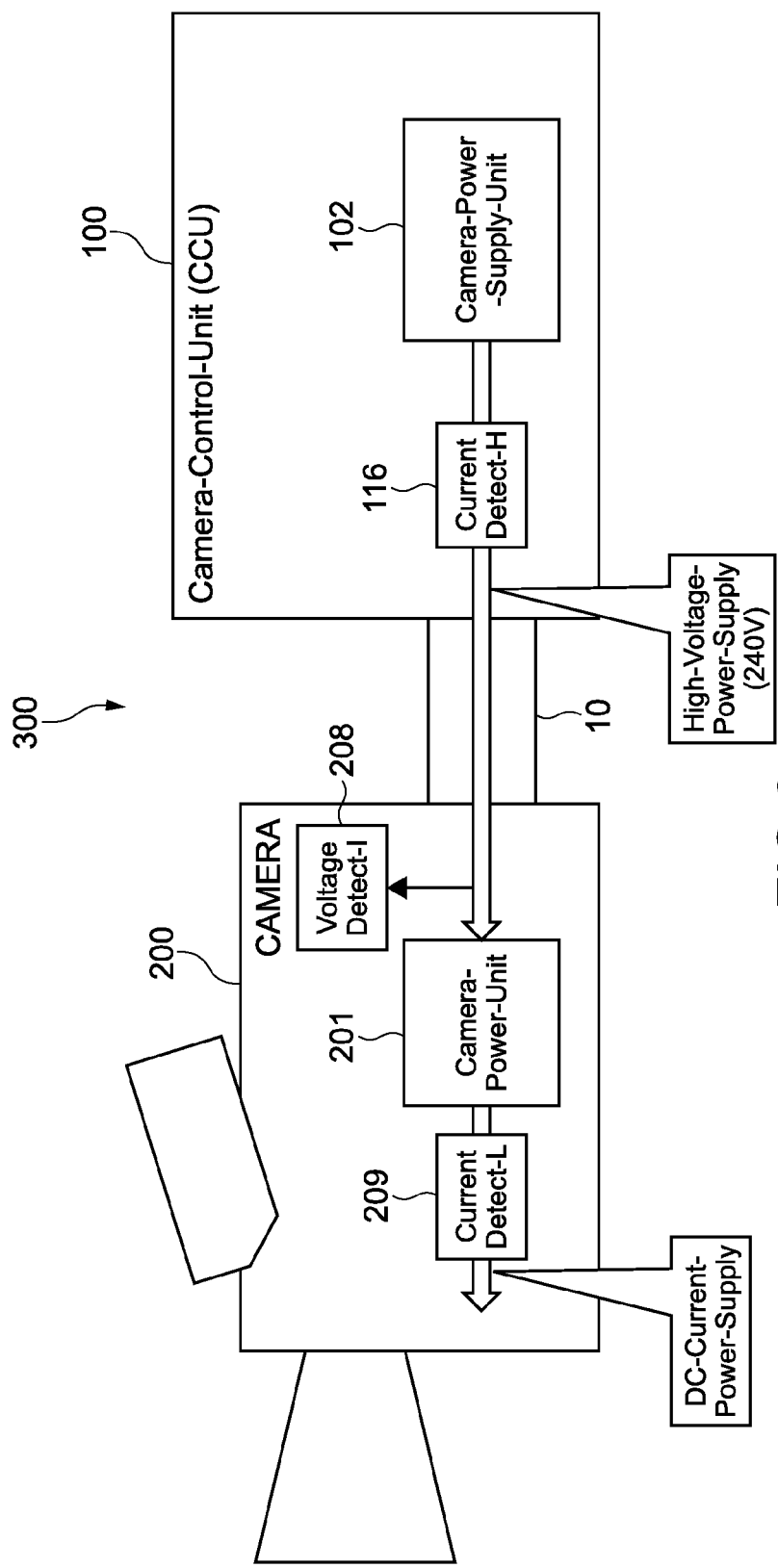
FIG. 2 is a schematic diagram showing a configuration embodiment of a power supply system according to the first embodiment.
Figure 3:
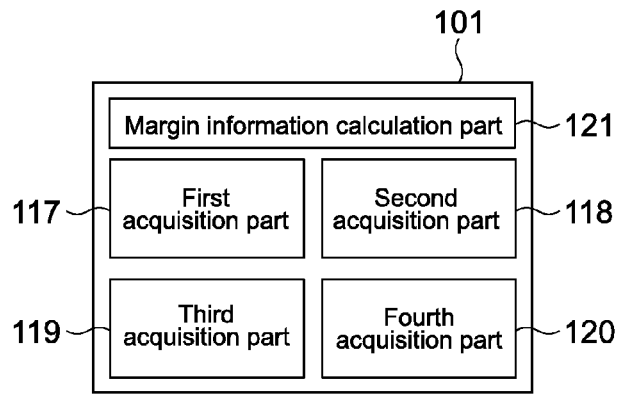
FIG. 3 is a schematic block diagram showing an embodiment of a software configuration of the power supply system.

A power supply system for use in the camera control system 500 having the above-described configuration according to this embodiment will be described. FIG. 2 is a schematic diagram showing a configuration embodiment of a power supply system 300 according to this embodiment. FIG. 3 is a schematic block diagram showing an example of a software configuration of the power supply system 300.

In the power supply system 300, the CCU 100 functions as the power supply apparatus. The camera 200 functions as the power reception apparatus. The cable 10 corresponds to the transmission path. As described above, when the electric power supply line in the cable 10 is provided as one cable, the electric power supply line may function as the transmission path.

As shown in FIG. 2, the power supply system 300 includes a power supply unit 102 (Camera-Power-Supply-Unit) of the CCU 100 and a current detection unit 116 (Current Detect-H) disposed on the CCU 100. Also, the power supply system 300 includes the electric power control unit 201 (Camera-Power-Unit), a voltage detection unit 208 (Voltage Detect-I) and a current detection unit 209 (Current Detect-L), all of which are disposed on the camera 200.

The power supply unit 102 can output 240V AC as a rated power supply voltage, and can output a current of 1.7 A as a maximum supply current. Also, the power supply unit 102 outputs 240V AC as a fixed voltage (see "High-Voltage-Power-Supply" in FIG. 2). Accordingly, in this embodiment, the rated power supply voltage corresponds to the power supply voltage output from the power supply apparatus and to the predetermined fixed voltage. The maximum supply current corresponds to supply available current.

In this embodiment, the rated power supply voltage and the maximum supply current may form information about a power supply capacity of the power supply unit 102, and becomes information contained in the information about a supply available electric power. As the rated power supply voltage is output as the fixed voltage, the rated power supply voltage may be the information contained in the information about the supply electric power output from the power supply apparatus.

The current detection unit 116 disposed on the CCU 100 detects the supply current output from the power supply unit 102. For example, a current value of a current flowing an output end (not shown) connected to the cable 10 is detected. As the current detection unit 116, any known current detection device in the past for detecting a DC or an AC may be used. For detecting a current, any method may be used.

The voltage detection unit 208 disposed on the camera 200 detects a voltage applied to the camera 200 after a voltage drop in the cable 10. In this embodiment, a voltage at reception end applied to an input end (not shown) of the camera 200 is detected as the applied voltage as described above. As the voltage detection unit 208, any known voltage detection device in the past for detecting a DC voltage or an AC voltage may be used. In addition, any method for detecting a voltage may be used.

The electric power control unit 201 supplies a predetermined electric power to each unit of the camera 200 based on the electric power supplied from the CCU 100. For example, the electric power control unit 201 supplies an electric power to a lens or an optical finder of the camera 200, or external devices etc. connected to the camera 200. The number, the type or the like of an accessary to which power is supplied from the electric power control unit 201 is not limited.

The electric power control unit 201 according to this embodiment can output a DC up to 10 A that is a maximum supply current (see DC-Current-Power-Supply in FIG. 2). The maximum supply current is included in the information about the suppliable electric power of the electric power control unit 201.

The current detection unit 209 disposed on the camera 200 detects a supply current output from the electric power control unit 201. For example, a value of a current flowing through an output end (not shown) of the current power control unit 201 is detected. The supply current is included in the information about the supply electric power output from the electric power control unit 201.

The information about the suppliable electric power on the electric power control unit and the information about the supply electric power output from the electric power control unit 201 are contained in the information on the electric power control unit. Accordingly, the maximum supply current and the supply current are included in the information on the electric power control unit.

The software configuration shown in FIG. 3 is achieved by the control unit 101 of the CCU 100. In other words, the CPU 113 of the control unit 101 executes a control program, thereby providing the software configuration.

A first acquisition part 117 acquires the information about the suppliable electric power of the CCU 100 that supplies an electric power to the camera 200 via the cable 10. Thus, by this embodiment, the first acquisition part 117 acquires the information about the rated power supply voltage and the maximum supply current. The information is output to a margin information calculation part 121.

The information about the rated power supply voltage and the maximum supply current is typically stored in the memory unit 112 of the CCU 100 in advance. Accordingly, the memory unit 112 may send the information to the margin information calculation part 121 instead of the first acquisition part 117.

A second acquisition part 118 acquires the information about the supply electric power output from the CCU 100, including the information about the supply voltage output from the CCU 100. Thus, by this embodiment, the second acquisition part 118 acquires the information about the rated power supply voltage and the supply current. The information is output to the margin information calculation part 121 by the second acquisition part 118.

The information about the supply current is detected by the current detection unit 116. Accordingly, the second acquisition part 118 acquires the information about the supply current from the current detection unit 116. For example, the current detection unit 116 may operate instead of the second acquisition part. In other words, the current detection unit 116 may send the information about the supply current detected and the information about the rated power supply voltage stored in the memory unit 112 etc. to the margin information calculation part 121. In this case, the current detection unit 116 functions as a detection unit (a first detection unit).

A third acquisition part 119 acquires the information about the voltage applied to the camera 200 after a voltage drop in the cable 10. In this embodiment, information about the voltage at reception end is acquired by the third acquisition part 119. The information about the voltage at reception end is output to the margin information calculation part 121 by the third acquisition part 119.

The information about the voltage at reception end is detected by the voltage detection unit 208 disposed on the camera 200. Thus, the third acquisition part 119 acquires the information about the voltage at reception end from the voltage detection unit 208 via the cable 10. For example, the control information communication units 104 and 203 are used for transmitting the information about the voltage at reception end. Alternatively, a module or the like for transmitting the information about the voltage at reception end may be disposed.

A fourth acquisition part 120 acquires the information about an electric power control unit that is the information about the electric power control unit 201 of the camera 200. Thus, by this embodiment, the fourth acquisition part 120 acquires the information about the maximum supply current of the electric power control unit 201 and the information about the supply current output from the electric power control unit 201. The information is output to the margin information calculation part 121 by the fourth acquisition part 120.

The information about the maximum supply current is typically stored on a memory unit etc. (not shown) of the camera 200. The information about the supply current is detected by the current detection unit 209 disposed on the camera 200. Thus, the fourth acquisition part 120 acquires the above-described information from the memory unit or the current detection unit 209. The method therefor is not limited.

The margin information calculation part 121 calculates first to third margin information as described below based on the information acquired by the first to fourth acquisition parts 117 to 120. The first to third margin information represents a margin to power supply limit. In other words, the first to third margin information enables to get a power supply status at present, and to recognize the margin for the power supply.

The margin information calculation part 121 calculates first margin information that represents the margin for the power supply based on the information about the suppliable electric power and the information about the supply electric power. In this embodiment, the first margin information is calculated by the following equation using the supply current of the CCU 100 and the maximum supply current of the CCU 100.

[First margin information (%)]:=CCU high pressure
power supply current/CCU maximum supply
current(:=Supply_Current A/max 1.7 A)  [Eq. 1]

The first margin information represents the power supply status at present of the power supply unit 102 of the CCU 100 to the power supply capacity. Thus, by the first margin information, the margin to the power supply limit of the power supply unit 102 can be checked.

In this embodiment, the power supply unit 102 outputs the fixed voltage of 240V. Hence, the maximum supply electric power has the almost same meaning as the maximum supply current. Accordingly, as shown in the above-described equation, a percentage (represented by %) of the supply current to the maximum supply current is calculated as the first margin information. For example, when the first margin information is nearly 100%, it turns out that the power supply unit 102 supplies an electric power at an almost limit capacity. On the other hand, when the first margin information has a low value, it turns out that the power supply unit 102 can supply power with a good margin.

In addition, the margin information calculation part 121 calculates second margin information about the margin of the voltage drop based on the information about the supply voltage and the information about the applied voltage. In this embodiment, the second margin information is calculated by the following equation using the rated power supply voltage and the voltage at reception end.

$$[\text{Second margin information (\%)}] := [\text{rated power supply voltage} - \text{voltage at reception end}]/[\text{rated power supply voltage} - \text{minimum operating voltage at reception end}](:=[240V-\text{Receipt Voltage}]/[240V-\text{min } 130V]) \quad [\text{Eq. 2}]$$

The second margin information represents a percentage of a voltage drop at present to an allowable limit of the voltage drop corresponding to a length of the cable 10. In other words, the allowable limit of the voltage drop is set where the power supply is stopped once the voltage drop exceeds a certain value. The margin of the voltage drop to the allowable limit is calculated as the second margin information.

A method of setting the allowable limit of the voltage drop is not limited. In this embodiment, a parameter of the minimum operating voltage at reception end is used for setting the allowable limit of the voltage drop, as shown in the above-described equations.

The minimum operating voltage at reception end is a half value of the fixed voltage or a value of a driving voltage necessary for driving the camera 200 (hereinafter described as "necessary driving voltage"), whichever greater. Accordingly, in this embodiment, 120V, half of the rated power supply voltage 240V, or the necessary driving voltage, whichever greater, becomes the minimum operating voltage at reception end.

The half value of the fixed voltage is a value set based on the maximum power transfer theorem and the supply power maximum rule. In other words, the value is set based on a thought that the power supply capacity is incapable of increasing when a loss by the cable 10 equals to the voltage at reception end applied to the camera. Therefore, the status that the half of the fixed voltage is lost due to the voltage drop is considered as the power supply limit.

On the other hand, when the voltage at reception end becomes not greater than the driving voltage necessary for the operation of the camera 200, the power supply is stopped (broken down). For example, the power supply is stopped, when the voltage at reception end is over the half of the fixed voltage but is less than the necessary driving voltage. Therefore, the half value of the fixed voltage or the minimum driving voltage, whichever greater, is set as the minimum operating voltage at reception end. So, the second margin information is calculated by the above-described equation. In this embodiment, the minimum operating voltage is set to 130V, which is set as the minimum operating voltage at reception end.

For example, when the second margin information is nearly 100%, it turns out that it is close to the allowable limit of the voltage drop. For example, it turns out that the cable 10 has a length almost reaching the limit. On the other hand, when the first margin information has a low value, it turns out that it is a state that the voltage drop is allowable. For example, it turns out that the cable 10 may be longer. Also, it is possible to detect abnormality etc. regarding a resistance of the cable 10.

In addition, the margin information calculation part 121 calculates third margin information that represents a margin for the power supply of the electric power control unit 201 based on the information on the electric power control unit. In this embodiment, the third margin information is calculated by the following equation using the maximum supply current (DC) and the supply current (DC) at the camera 200 side.

$$[\text{Third margin information (\%)}] := \text{camera DC supply current}/\text{camera maximum DC power supply current}(:=\text{Supply\_DC\_Current A/max 10 A}) \quad [\text{Eq. 3}]$$

The third margin information represents the power supply status at present of the power supply unit 201 of the camera 200. Thus, by the third margin information, the margin to the power supply limit of the electric power control unit 201 can be checked. For example, when the third margin information is nearly 100%, it turns out that the power control unit 201 supplies an electric power at an almost limit capacity. On the other hand, when the third margin information has a low value, it turns out that the power control unit 201 can supply power with a good margin.

For example, a consumed electric power depends on a lens or an optical finder of the camera 200, or a type, a number etc. of external devices etc. connected to the camera 200. When the camera 200 includes many accessories, the power supply capacity by the electric power control unit 201 may reach the limit. In this case, the operation of the entire camera control system 500 will be stopped. Such a stoppage can be prevented before it happens by referring to the third margin information, for example.

The margin information calculation part 121 outputs at least one of the first to third margin information calculated as the display information displayed on the display unit 111. Thus, it is possible to get a power supply status via the display unit 111. For example, the margin information may be output to a display apparatus disposed as the external device outside of the CCU 100.

The display information based on the first to third margin information may be sent to the camera 200 via the cable 10. In this way, the power supply status can be got via the display unit 207 also at the camera 200 side.

The margin information having the greatest value among the first to third margin information may be output and displayed on the display unit 111, for example. Alternatively, all of the first to third margin information may be output and displayed on the display unit 111.

Figure 4:
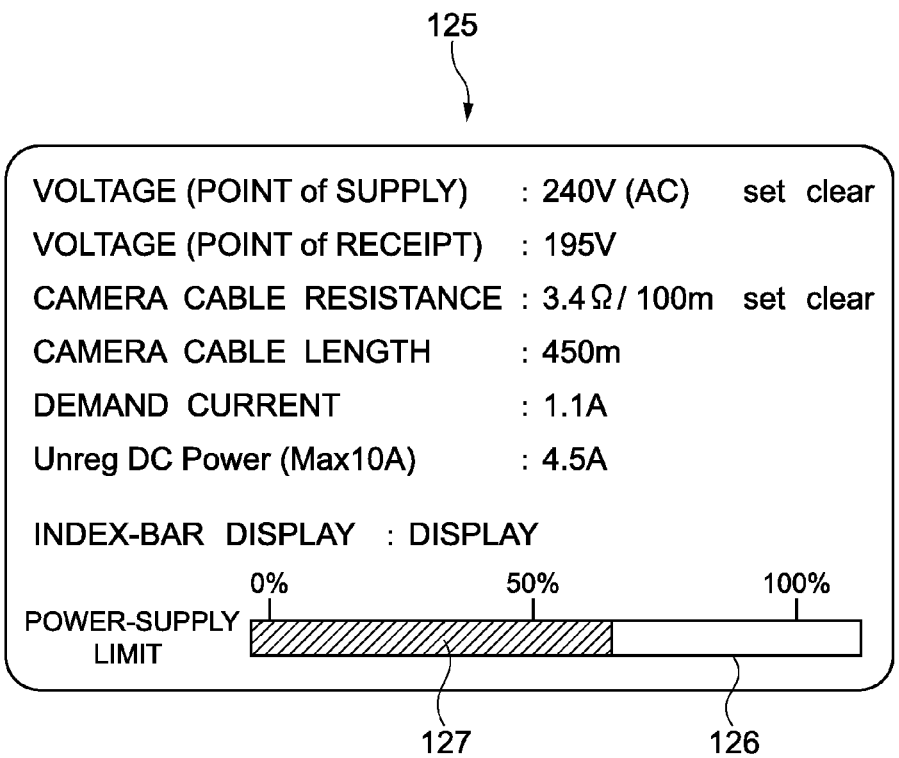
FIG. 4 is a schematic diagram showing margin information displayed on a display unit according to the first embodiment.

FIG. 4 is a schematic diagram showing the margin information displayed on the display unit 111 according to this embodiment. Hereinafter, the display on which the margin information is displayed is described as a margin information display.

In this embodiment, maximum value margin information 127, which is the margin information having the highest value among the first to third margin information, is displayed on a margin information display 125. As shown in FIG. 4, the maximum value margin information 127 is displayed as the power supply limit. Moreover, the value of the maximum value margin information 127 is displayed as a lateral bar chart 126. Alternatively, the value of the maximum value margin information 127 may be displayed as is. The user may choose the way to display. In FIG. 4, an item of "INDEX-BAR DISPLAY" is set on the "DISPLAY", and the bar chart is chosen.

The bar chart 126 shown in FIG. 4 can display 100% or more. This is because the power supply is not stopped as soon as the value of the margin information reaches 100%, and the power supply system 300 can be continued to be operated.

In this embodiment, the rated power supply voltage "VOLTAGE (POINT of SUPPLY)", the supply voltage from the power supply unit 102 "VOLTAGE (POINT of RECEIPT)", the resistance of the cable 10 "CAMERA CABLE RESISTANCE", the length of the cable 10 "CAMERA CABLE LENGTH", the supply current from the power supply unit 102 "DEMAND CURRENT", and the maximum supply current of the electric power control unit 201 "Unreg DC Power (Max 10 A)" are displayed on the margin information display 125.

In this way, acquired various information may be displayed on the margin information display 125 together with the margin information. It is thus possible to get the power supply status more specifically. In that sense, all of the first to third margin information may be displayed, whereby the power supply status can be got in detail. On the other hand, only the maximum value margin information 127 is displayed, the margin information display 125 becomes easily viewable and the power supply status is easily got.

As an example, when the value of the margin information is nearly 100%, a predetermined UI, an alarm sound etc. may inform it.

Also, in this embodiment, the user can input the rated power supply voltage and the resistance of the cable 10. It is also possible to clear the input information. Configurations of the UI on the margin information display 125, types of the information displayed on the margin information display 125, items input by the user etc. are not limited, and may be set as appropriate.

As described above, in the power supply system 300, the information about the available electric power of the CCU 100, the information about the supply electric power output from the CCU 100, and the information about the voltage applied to the camera 200 are acquired by the CCU 100. Based on the acquired information, the first margin information representing the margin for the power supply and the second margin information representing the margin about the voltage drop in the cable 10 are calculated. When the first and second margin information is used appropriately, the power supply status can be got. As a result, it can provide the power supply system 300 having good operability that supplies an electric power via the cable 10.

Also in this embodiment, the power supply status of the electric power control unit 201 at the camera 200 side is calculated by the CCU 100 as the third margin information. Thus, it is possible to provide the power supply system 300 having better operability.

In the camera control system 500 described in this embodiment, the CCU 100 is often connected with the camera 200 via a long cable 10. In this case, the power supply system 300 becomes a system accompanied by a long distance power supply. Especially when the long distance power supply is made, it is difficult to get correctly the limit value of the power supply capacity for the distance and the margin of the consumed electric power at a power reception side.

As a reason thereof, a maximum power supply distance that is a maximum distance capable of supplying an electric power is affected by the consumed electric power at the power reception side that is a load side. For example, in the camera control system where the camera is disposed at the power reception side, the consumed electric power is significantly changed by a zooming operation using a big lens, lighting by a tarry lamp, etc. Also, it can be cited as the reason that the power supply limit at the power supply side is determined by more than one factor.

Therefore, a peak load is calculated depending on a specification status at the load side (camera, power reception side), for example. Based on predetermined load conditions, the maximum power supply distance is calculated in advance, and the system is operated within the distance. While the system is actually operated, it is not permitted to reach the power supply limit and to power down (break down) the system. Therefore, in order to calculate the maximum power supply distance or the like, it should consider the worst case and have the margin for the actual operation.

In such operation, the power supply limit is determined only by the equations and the operation is made within the power supply limit. Thus, the actual status is not known. Therefore, as to a quality of the power supply cable (the camera cable), once a resistance load in an electrical transmission exceeds the supposition, the system will power down even if the system is operated within the calculated power supply limit. Concerning the load conditions, once the load is applied exceeding the supposition, the system will power down.

In contrast, in the power supply system 300 according to this embodiment, the first to third margin information is calculated based on the information about the power supply capacity of the power supply unit 102 of the CCU 100 and the information about the supply voltage, the supply current and the like under the status that the electric power is supplied. Therefore, the first to third margin information is calculated as real time information that represents the power supply status. The information is displayed on the margin information display 125 as appropriate.

As a result, the actual power supply status is displayed on the display unit 111, and can be recognized by the user. In addition, even if the status exceeding the supposition occurs (an impedance of the cable becomes high, a load electric power of a camera accessory becomes high, etc.), the effect thereof can be monitored in real time. Also, even if the long distance power supply is made, a high load is applied at the load side, etc., the actual power supply status and the load status can be got. Accordingly, the margin for the operation may not be considered more than necessary. Thus, it is possible to fully exercise the power supply capacity of the power supply system 300.

Typically, when the camera control system 500 is set up, the above-described processing is executed to be displayed on the margin information display 125. Then, the power supply status of the power supply system 300 is checked in real time. However, the margin information display 125 may display the margin information at other timing.

Second Embodiment

A power supply system according to a second embodiment of the present technology will be described. Hereinafter, as to the similar configurations and actions of the power supply system 300 as described in the above embodiment, detailed description thereof will be omitted or simplified.

In the power supply system according to this embodiment, a method of acquiring the information about the supply current at the second acquisition part is different from that in the above-mentioned power supply system 300. The information about the supply current is output from the power supply unit of the CCU.

In the second acquisition part according to this embodiment, the information about the supply current is acquired by calculating the supply current based on the information about the supply voltage, the information about the applied voltage and the information about the resistance of the transmission path corresponding to the length of the transmission path. In this embodiment, the supply current is calculated by the following equation using the supply voltage, the voltage at reception end, a unit impedance that is the resistance of the cable (transmission path) in the unit length and a cable length (transmission path length).

$$I\text{sup}=(V\text{sup}-V\text{receipt})/(Rs \times Lt) \quad \text{[Eq. 4]}$$

Isup: supply current [A]
Vsup: supply voltage [V]
Vreceipt: voltage at reception end [V]
Rs: unit impedance of transmission path [Ω/m]
Lt: transmission path length Thus, the information about the supply current may be calculated based on the above-described information. As a result, the current detection unit 116 disposed on the CCU 100 as shown in FIG. 2 becomes unnecessary. When a high voltage as high as 240V is supplied as described in the above-mentioned embodiment, detecting output supply current may be difficult. In other words, in order to provide the current detection unit, a special circuit configuration for detecting a current under the high voltage may be necessary, or special parts that can withstand the high voltage may be necessary. Undesirably, the special circuit configuration having a large area may result in an enlargement of the CCU, or the special parts may result in an increase of the costs. This embodiment can avoid possible occurrence of the problems.

Among them, the information about the supply voltage and the voltage at reception end are acquired by the method similar to that described in the first embodiment. The unit impedance of the cable is typically input by a user. The method of acquiring the cable length is not limited, but the information about the cable length is calculated as follows in this embodiment.

Figure 5:
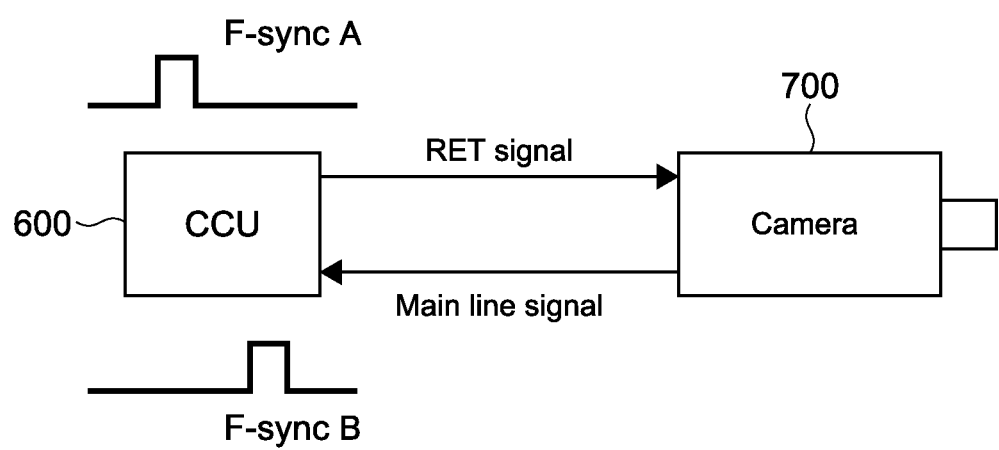
FIG. 5 is a schematic diagram for illustrating a method of calculating information about a cable length according to a second embodiment.

FIG. 5 is a schematic diagram for illustrating the method of calculating the information about the cable length according to this embodiment. Similar to the first embodiment, the synchronizing signals (the frame synchronizing signal, the vertical synchronizing signal and the horizontal synchronizing signal) are output from a video data processing unit of a CCU 600 at a predetermined phase. The clock signal generation unit generates the clock signal at 74 MHz. The synchronizing signals and the clock signal are transmitted to a camera 700 via a cable. The synchronizing signals are transmitted to the camera, for example, by putting on the RET signals.

The synchronizing signals transmitted from the CCU 600 to the camera 700 correspond to a reference synchronizing signal transmitted from the power supply apparatus (the CCU 600) to the power reception apparatus via the transmission path (the cable) in order to control an operation timing of the power reception apparatus (the camera 700).

Hereinafter, the synchronizing signal transmitted from the CCU 600 to the camera 700 is described as the reference synchronizing signal.

At the camera 700 side, the image sensor is controlled based on the reference synchronizing signal transmitted and the clock signal. In other words, the video data is read out at a predetermined timing, and a main line signal including the video data is transmitted to the CCU 600. The synchronizing signals are put on the main line signal, and the main line signal is transmitted to the CCU 600 such that the reference synchronizing signal output from the CCU 600 and the synchronizing signals put on the main line signal are in-phase.

In this embodiment, the reference signal transmitted from the camera 700 to the CCU 600 corresponds to a reply synchronizing signal returned from the power reception apparatus to the power supply apparatus at the operation timing controlled based on the reference synchronizing signal.

By the effect of the cable length, a delay is generated each upon the transmittance of the reference synchronizing signal and the transmittance of the reply synchronizing signal. As a result, a difference between the phase of the reference synchronizing signal transmitted at the predetermined phase and the phase of the reply synchronizing signal reached the CCU 600 is generated. In this embodiment, the information about the cable length is calculated based on the difference between the phase of the reference synchronizing signal and the phase of the reply synchronizing signal.

As shown in FIG. 5, in this embodiment, as the reference synchronizing signal and the reply synchronizing signal for comparing the phases, frame synchronizing signals (see an F-sync A and an F-sync B) are used. Hereinafter, the reference synchronizing signal is described as the frame synchronizing signal A and the reply synchronizing signal is described as the frame synchronizing signal B, respectively. Alternatively, as the reference synchronizing signal and the reply synchronizing signal, the vertical synchronizing signal and the horizontal synchronizing signal may be used.

Figure 6:
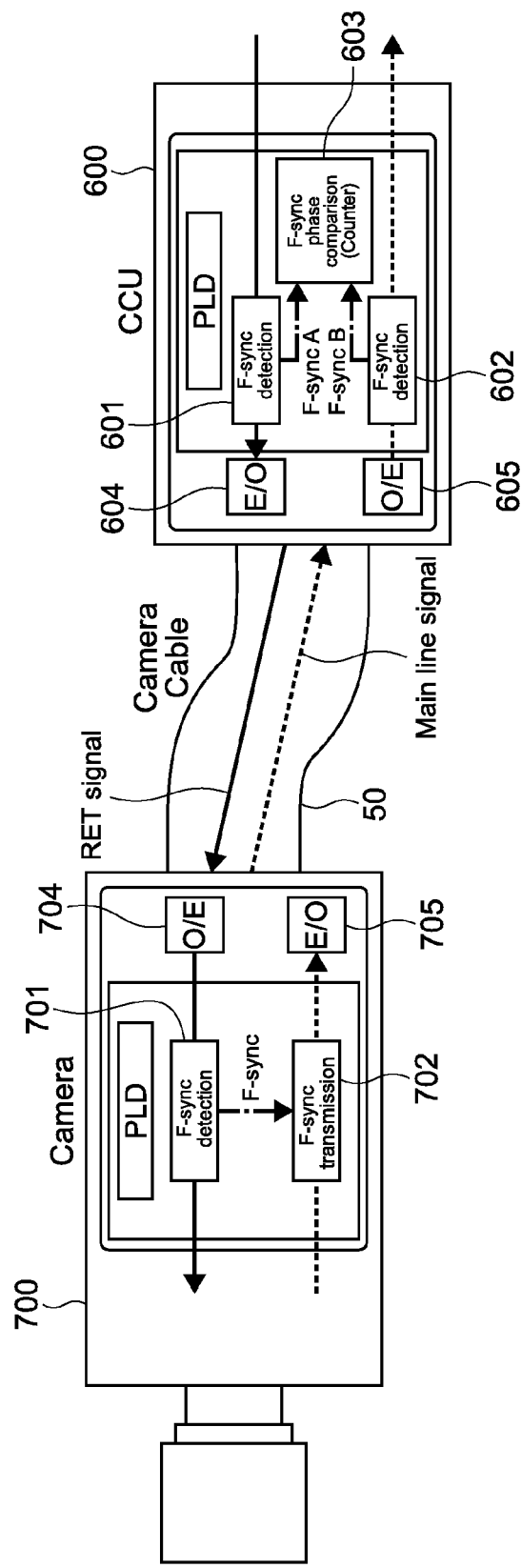
FIG. 6 is a schematic diagram showing a configuration embodiment for calculating a phase difference between a reference synchronizing signal and a reply synchronizing signal.

FIG. 6 is a schematic diagram showing a configuration embodiment for calculating the phase difference between the reference synchronizing signal and the reply synchronizing signal. The CCU 600 includes a detection unit 601 for detecting the frame synchronizing signal A, a detection unit 602 for detecting the frame synchronizing signal B, and a synchronizing signal comparing part 603 for receiving the both synchronizing signals and calculating the difference by comparing the phases.

The camera 700 includes a detection unit 701 for detecting the phase of the frame synchronizing signal A, and an output control part 702 for outputting the main line signal based on the synchronizing signal detected on the detection unit 701. These blocks are realized based on a PIL (Programmable Logic Device), but are not limited thereto.

The detection unit 601 of the CCU 600 detects the frame synchronizing signal A put on the RET signal, and outputs it to the synchronizing signal comparing part 603. The RET signal is transmitted to the camera 700 via an E/O (Electronic/Optical) signal converter 604 and an O/E (Optical/Electronic) signal converter 704.

The detection unit 701 of the camera 700 detects the frame synchronizing signal A from the RET signal received by the camera 700, and outputs it to the output control part 702. The output control part 702 outputs the main line signal put on the frame synchronizing signal B at a predetermined timing based on the frame synchronizing signal A received.

The main line signal is transmitted to the CCU 600 via an E/O converter 705 and an O/E converter 605.

The detection unit 602 of the CCU 600 detects the frame synchronizing signal B put on the main line signal, and outputs it to the synchronizing signal comparing part 603. The synchronizing signal comparing part 603 calculates the phase difference between the frame synchronizing signal A and the frame synchronizing signal B.

Figure 7:
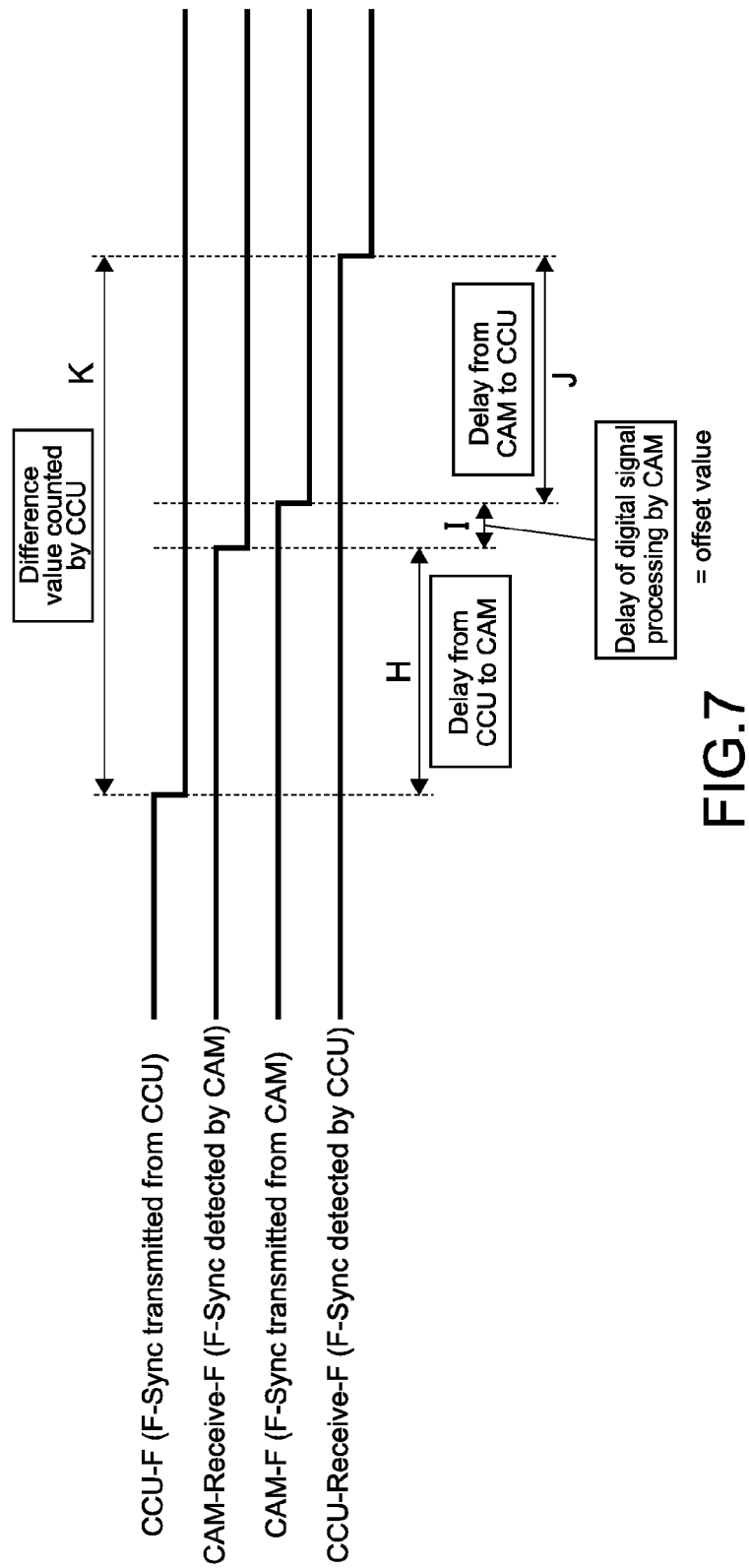
FIG. 7 is a schematic diagram for illustrating a phase difference between frame synchronizing signals.

FIG. 7 is a schematic diagram for illustrating the phase difference between the frame synchronizing signal A and the frame synchronizing signal B. A delay phase difference H is generated between the frame synchronizing signal A transmitted by the CCU 600 (detected by the detection unit 601) and the frame synchronizing signal A received by the camera 700 (detected by the detection unit 701) in accordance with the transmission from the CCU 600 to the camera 700. The delay depends on the flame length.

A phase difference I is generated by a delay in accordance with a digital signal processing of the camera 700 between the frame synchronizing signal A received by the camera 700 and the frame synchronizing signal B transmitted by the output control part 702 of the camera 700. The delay is generated irrespective of the frame length, and the phase difference I is therefore set as an offset value.

A phase difference J is generated by a delay in accordance with the transmission from the camera 700 to the CCU 600 between the frame synchronizing signal B transmitted from the camera 700 and the frame synchronizing signal B received by the CCU 600 (detected by the detection unit 602). The delay is generated in respect to the frame length.

A phase difference K summed up these phase differences H, I and J is calculated by the synchronizing signal comparing part 603 as the phase difference between the reference synchronizing signal and the reply synchronizing signal. The phase difference K is represented by a count number of the clock signal at 74 MHz. The value of the count number is converted by the following equation, thereby calculating the cable length.

$$Z=((\text{Count}-\text{Offset})\times T/(1/v))/2 \qquad [\text{Eq. 5}]$$

Z: transmission distance [m]
Count: CLK number of phase distance
Offset: delay CLK number by signal processing (CLK number irrelevant to transmission)
T: CLK frequency [s]
v: speed of transmission medium [m/s]
(Ex.) in the case of optical fiber v=c/n (c: light speed, n: reflectance)

In other words, the offset value irrelevant to the cable length is subtracted from the total count value. Then, the distance is calculated from the count number corresponding to the cable length using the information about the frequency and the speed. The distance calculated is a to and from distance, and then divided by 2, thereby calculating the cable length.

Thus, the information about the length of the cable 50 for calculating the information about the supply current may be calculated based on the phase difference between the reference synchronizing signal and the reply synchronizing signal. In this way, the length of the cable 50 can be easily calculated. As the reference synchronizing signal and the reply synchronizing signal, the frame synchronizing signals are used. In other words, in this embodiment, the signals already used in the video control system are also used as appropriate, thereby calculating the length of the cable 50. In this way, setting a new synchronizing signal for calculating the length of the cable 50 is unnecessary, and the length of the cable 50 can be easily calculated.

In the above description, the second acquisition part calculates the information about the supply current and the information about the cable length. However, a module and the like for calculating the information about the supply current and the information about the cable length may be disposed separately from the second acquisition part.

Modified Embodiment

The embodiments according to the present technology are not limited to the above-described embodiments, and variations and modifications may be made.

As described above, the fixed voltage is output from the supply voltage at the power supply unit of the CCU that is the power supply apparatus. However, the forms of the voltage and the current output as the suppliable electric power of the power supply apparatus are not limited. For example, a constant voltage power supply outputting a constant voltage, or a constant current power supply for outputting a constant current may be used as the power supply unit as described above. The voltage and the current outputted may be AC or DC.

Figure 8:
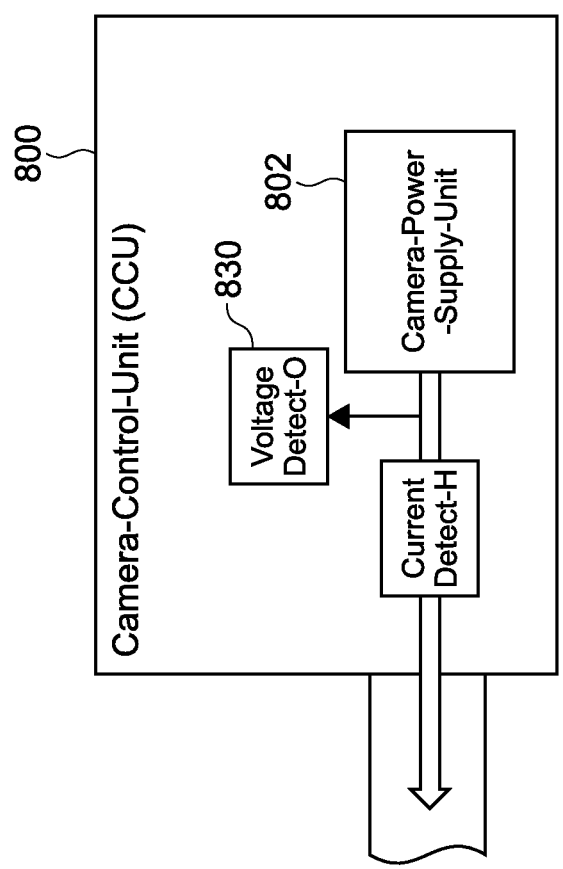
FIG. 8 is a schematic diagram showing a modified embodiment of a configuration of a CCU that is a power supply apparatus.

As shown in FIG. 8, a voltage detection unit 830 for detecting a supply voltage outputted from a power supply unit 802 may be disposed. This enables to get a power supply status by the power supply unit 802 when the supply voltage is not the fixed voltage, or the like. Even when a power supply voltage is the fixed voltage, the power supply voltage may change. As an example, a power supply having a transformer is used as the power supply unit 802, the change may be induced. In this case, by disposing the voltage detection unit 830, the supply voltage can be calculated precisely, and the margin information can be calculated with high precision.

In the above-described embodiments, the CCU that is the power supply apparatus also functions as the detection apparatus according to this embodiment including the first to fourth acquisition parts and the margin information calculation part. In addition, as described above, the memory unit is substituted for the first acquisition part and the current detection unit is substituted for the second acquisition part, whereby the power supply apparatus may have the functions of the detection unit.

On the other hand, the camera that is the power reception apparatus also functions as the detection apparatus according to this embodiment including the first to fourth acquisition parts and the margin information calculation part. For example, the control unit of the camera may achieve the software configuration as shown in FIG. 3. In addition, the electric power control unit is substituted for the power reception unit, and the voltage detection unit is substituted for the third acquisition part, whereby the power reception apparatus may have the functions of the detection unit. In this case, the voltage detection unit functions as a detection unit (a second detection unit).

Alternatively, there may be provided the detection apparatus according to this embodiment including the first to fourth acquisition parts and the margin information calculation part separately from the power supply apparatus and the power reception apparatus. For example, the detection apparatus may be connected to each of the power supply apparatus and the power reception apparatus via the cable, for example. Also, the detection apparatus may be connected via a transmission path etc. being different from the cable for power supplying.

The detection apparatus according to this embodiment may include the first to third acquisition parts and the margin information calculation part. In other words, only the first and second margin information acquired by first to third acquisition parts is calculated, it is possible to fully get the power supply status of the power supply system.

The configuration of the camera control system as described is not limited. In addition, the power supply system according to this embodiment is applicable to the system other than the camera control system. For example, as the power reception apparatus, a video editing apparatus, a predetermined relay apparatus or the like may be used. In other words, the power supply system according to the embodiment of the present technology can be applied to any system as long as the electric power is supplied from the power supply apparatus to the power reception apparatus via the transmission path.

The above-described various processings may be executed by hardware or software. When the above-described various processings are executed by the software, the program of the software is executed by installing from a program recording medium to the computer built in dedicated hardware. Alternatively, the program may be installed via a network etc.

The program executed by the computer may be a program processed as time series in the exact order described in the specification, or a program processed at an adequate timing, e.g., in parallel or upon invoking. For example, the processings in the first to fourth acquisition parts may be executed in a predetermined order or in parallel.

The program may be processed by one computer, or may be distributedly processed by a plurality of computers. Furthermore, the program may be executed by transferring it to a remote computer.

At least two of the features in the above-described embodiments can be combined.

The present technology may have the following configurations.

(1) A detection apparatus, including:
a first acquisition part that acquires information about a suppliable electric power of a power supply apparatus that supplies an electric power to a power reception apparatus via a transmission path;
a second acquisition part that acquires information about a supply electric power output from the power supply apparatus, including information about a supply voltage output from power supply apparatus;
a third acquisition part that acquires information about a voltage applied to the power reception apparatus after a voltage drop in the transmission path; and
a margin information calculation part that calculates first margin information about a margin of a supply electric power based on the information about the suppliable electric power and the information about the supply electric power, and calculates second margin information about a margin of the voltage drop based on the information about the supply voltage and the information about the applied voltage.

(2) The detection apparatus according to (1) above, in which
the power supply apparatus outputs a predetermined fixed voltage as the supply voltage,
the information about the suppliable electric power includes information about the suppliable electric power of the power supply apparatus,
the information about the supply electric power includes information about a supply electric power output from the power supply apparatus, and
the margin information calculation part calculates the first margin information based on the information about the suppliable electric power and the information about the supply electric power.

(3) The detection apparatus according to (2) above, in which
the information about the supply voltage includes the information about the fixed voltage, and
the margin information calculation part calculates the second margin information based on the information about the fixed voltage and the information about the applied voltage.

(4) The detection apparatus according to (3) above, in which
the margin information calculation part calculates the second margin information using a greater value among a half value of the fixed voltage and a value of a driving voltage necessary for driving the power reception apparatus.

(5) The detection apparatus according to any one of (1) to (4), in which
the power reception apparatus includes an electric power control unit for supplying a predetermined electric power,
the detection apparatus further includes a fourth acquisition part that acquires information about an electric power control unit including information about a suppliable electric power of the electric power control unit and information about a supply electric power output from the electric power control unit, and
the margin information calculation part calculates third margin information that represents a margin of the supply electric power on the electric power control unit based on the information about the electric power control unit.

(6) The detection apparatus according to any one of (2) to (5), in which
the second acquisition part calculates and acquires the information about the supply current based on the information about the supply voltage, the information about the applied voltage and the information about the resistance of the transmission path corresponding to the length of the transmission path.

(7) The detection apparatus according to (6) above, in which
the information about the length of the transmission path is calculated based on a difference between a phase of a reference synchronizing signal transmitted from the power supply apparatus to the power reception apparatus via the transmission path in order to control the operation timing of the power reception apparatus, and a phase of a reply synchronizing signal returned from the power reception apparatus to the power supply apparatus at the operation timing controlled based on the reference synchronizing signal.

(8) The detection apparatus according to (7) above, in which
the reference synchronizing signal and the reply synchronizing signal are each a frame synchronizing signal.

(9) The detection apparatus according to any one of (1) to (8) above, in which
the margin information calculation part outputs at least one of the first and second margin information calculated as display information displayed on a display unit.

The present technology contains subject matter related to that disclosed in Japanese Priority Patent Application JP 2012-105348 filed in the Japan Patent Office on May 2, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A detection apparatus, comprising:
a power supply apparatus;
a detection apparatus display unit; and
one or more processors configured to:
control a camera via a transmission path to:
capture an image, and
display the captured image on a camera display unit of the camera,
wherein the transmission path couples the detection apparatus and the camera;
calculate a length of the transmission path based on one of a clock frequency or a speed of a reference synchronizing signal in a transmission medium, and based on a speed of a reply synchronizing signal in the transmission medium,
wherein the reference synchronizing signal is transmitted from the power supply apparatus to a power reception apparatus of the camera via the transmission path, and
wherein the reply synchronizing signal is returned from the power reception apparatus to the power supply apparatus;
determine first margin information based on the calculated length of the transmission path;
determine a power supply capacity of the power supply apparatus based on the first margin information;
generate power supply capacity information that includes the determined power supply capacity;
control transmission of the power supply capacity information, via the transmission path, to display the power supply capacity information on the camera display unit;
monitor the power supply apparatus in real time based on the displayed power supply capacity information;
receive the captured image from the camera via the transmission path; and
control the detection apparatus display unit to display the received captured image.

2. The detection apparatus according to claim 1, wherein the one or more processors are further configured to:
acquire information about a suppliable electric power of the power supply apparatus,
wherein the power supply apparatus is configured to supply an electric power to the power reception apparatus via the transmission path;
acquire information about a supply electric power output from the power supply apparatus, wherein the acquired information about the supply electric power includes information about a supply voltage output from the power supply apparatus;
acquire information about a voltage applied to the power reception apparatus after a voltage drop in the transmission path,
wherein the first margin information is about a first margin of the supply electric power based on the information about the suppliable electric power and the information about the supply electric power;
determine second margin information about a margin of the voltage drop based on the information about the supply voltage and the information about the applied voltage; and
output a fixed voltage as the supply voltage.

3. The detection apparatus according to claim 2,
wherein the information about the supply voltage includes information about the fixed voltage, and
the one or more processors are further configured to determine the second margin information based on the information about the fixed voltage and the information about the applied voltage.

4. The detection apparatus according to claim 3,
wherein the one or more processors are further configured to determine the second margin information based on a greater value among a half value of the fixed voltage and a value of a driving voltage to drive the power reception apparatus.

5. The detection apparatus according to claim 2,
wherein the power reception apparatus includes an electric power control unit configured to supply the electric power, and
the one or more processors are further configured to:
acquire information about the electric power control unit,
wherein the information about the electric power control unit includes information about the suppliable electric power of the electric power control unit and information about the supply electric power output from the electric power control unit, and
determine third margin information,
wherein the third margin information indicates a second margin of the supply electric power on the electric power control unit based on the information about the electric power control unit.

6. The detection apparatus according to claim 2,
wherein the one or more processors are further configured to calculate and acquire the information about a supply current based on the information about the supply voltage, the information about the applied voltage and the information about a resistance of the transmission path corresponding to the length of the transmission path.

7. The detection apparatus according to claim 1,
wherein each of the reference synchronizing signal and the reply synchronizing signal is a frame synchronizing signal.

8. The detection apparatus according to claim 2,
wherein the one or more processors are further configured to output at least one of the first margin information or the second margin information, and
wherein the at least one of the first margin information or the second margin information is determined as display information displayed on the detection apparatus display unit.

9. The detection apparatus according to claim 1, wherein the length of the transmission path is calculated by equation 1:

$$Z=[(\text{Count}-\text{Offset})*T/(1/v)]/2 \qquad (1)$$

wherein "Z" is the length of the transmission path, "Offset" is a delay of the reference synchronizing signal and the reply synchronizing signal, "T" is a clock frequency, "v" is a speed of the reference synchronizing signal in the transmission medium, and "Count" is clock number of phase distance.

10. A power supply apparatus, comprising:
one or more processors configured to:
supply an electric power to a power reception apparatus of a camera via a transmission path;

store information about a suppliable electric power of the power supply apparatus;

control the camera, to capture an image and display the captured image on a display unit of the camera, via the transmission path,
　wherein the transmission path couples the power supply apparatus and the camera;

calculate a length of the transmission path based on one of a clock frequency or a speed of a reference synchronizing signal in a transmission medium, and based on a speed of a reply synchronizing signal in the transmission medium,
　wherein the reference synchronizing signal is transmitted from the power supply apparatus to a power reception apparatus of the camera via the transmission path, and
　wherein the reply synchronizing signal is returned from the power reception apparatus to the power supply apparatus;

determine margin information based on the calculated length of the transmission path;

determine a power supply capacity of the power supply apparatus based on the margin information;

generate power supply capacity information that includes the determined power supply capacity;

control transmission of the power supply capacity information, via the transmission path, to display the power supply capacity information on the display unit of the camera; and monitor the power supply apparatus in real time based on the displayed power supply capacity information.

11. A camera, comprising:

a display unit; and one or more first processors configured to:
　receive an electric power supplied from a power supply apparatus of a detection apparatus via a transmission path; and
　capture an image and display the captured image on the display unit based on reception of a control instruction from the detection apparatus via the transmission path,
　　wherein the transmission path couples the detection apparatus and the camera, and
　　wherein the detection apparatus comprises one or more second processors configured to:
　　　calculate a length of the transmission path based on one of a clock frequency or a speed of a reference synchronizing signal in a transmission medium, and based on a speed of a reply synchronizing signal in the transmission medium,
　　　　wherein the reference synchronizing signal is transmitted from the power supply apparatus of the detection apparatus to a power reception apparatus of the camera via the transmission path, and
　　　　wherein the reply synchronizing signal is returned from the power reception apparatus to the power supply apparatus,
　　　determine margin information based on the calculated length of the transmission path;
　　　determine a power supply capacity of the power supply apparatus based on the margin information;
　　　generate power supply capacity information that includes the determined power supply capacity;
　　　control transmission of the power supply capacity information, via the transmission path, to display the power supply capacity information on the display unit; and
　　　monitor the power supply apparatus in real time based on the displayed power supply capacity information.

12. A power supply system, comprising:

a power supply apparatus, which includes:
　a power supply unit configured to supply an electric power to a power reception apparatus connected via a transmission path;
　a memory unit configured to store information about a suppliable electric power of the power supply unit; and
　one or more processors configured to control:
　　the power reception apparatus, to capture an image and display the captured image on a display unit of the power reception apparatus, via the transmission path,
　　　wherein the transmission path is configured to couple the power supply apparatus and the power reception apparatus, and
the power reception apparatus includes a power reception unit,
　wherein the power reception unit is configured to receive the electric power supplied from the power supply apparatus,
　wherein the power reception unit and the power supply apparatus are connected via the transmission path, and
　wherein the one or more processors are further configured to:
　　calculate a length of the transmission path based on one of a clock frequency or a speed of a reference synchronizing signal in a transmission medium, and based on a speed of a reply synchronizing signal in the transmission medium,
　　　wherein the reference synchronizing signal is transmitted from the power supply apparatus to a power reception apparatus via the transmission path, and
　　　wherein the reply synchronizing signal is returned from the power reception apparatus to the power supply apparatus;
　　determine margin information based on the calculated length of the transmission path;
　　determine a power supply capacity of the power supply apparatus based on the margin information;
　　generate power supply capacity information that includes the determined power supply capacity;
　　control transmission of the power supply capacity information, via the transmission path, to display the power supply capacity information on the display unit;
　　monitor the power supply apparatus in real time based on the displayed power supply capacity information;
　　receive the captured image via the transmission path; and
　　display the captured image on the display unit.

13. A non-transitory computer-readable medium having stored thereon, computer-executable instructions, that when executed by a detection apparatus, cause the detection apparatus to execute operations, the operations comprising:
　controlling a camera, to capture an image and display the captured image on a camera display unit of the camera, via a transmission path, wherein the transmission path couples the detection apparatus and the camera,
　calculating a length of the transmission path based on one of a clock frequency or a speed of a reference synchronizing signal in a transmission medium, and based on a speed of a reply synchronizing signal in the transmission medium,
wherein the reference synchronizing signal is transmitted from a power supply apparatus of the detection apparatus to a power reception apparatus of the camera via the transmission path, and
wherein the reply synchronizing signal is returned from the power reception apparatus to the power supply apparatus;
determining margin information based on the calculated length of the transmission path;
determining a power supply capacity of the power supply apparatus based on the margin information;
generate power supply capacity information that includes the determined power supply capacity;
controlling transmission of the power supply capacity information, via the transmission path, to display the power supply capacity information on the camera display unit;
monitoring the power supply apparatus in real time based on the displayed power supply capacity information;
receiving the captured image via the transmission path; and
displaying the captured image on a detection apparatus display unit of the detection apparatus.

* * * * *